(12) United States Patent
Galmiche et al.

(10) Patent No.: US 10,546,091 B2
(45) Date of Patent: Jan. 28, 2020

(54) MAGNETIC MASS FOR ROTOR, AND CORRESPONDING ROTOR, ELECTRIC MACHINE AND MANUFACTURING METHOD

(71) Applicant: GE ENERGY POWER CONVERSION TECHNOLOGY LIMITED, Rugby, Warwickshire (GB)

(72) Inventors: Christoph Galmiche, Champigneulles (FR); Stephane Ayllon, Champigneulles (FR)

(73) Assignee: GE ENERGY POWER CONVERSION TECHNOLOGY LTD (GB)

( * ) Notice: Subject to any disclaimer, the term of this patent is extended or adjusted under 35 U.S.C. 154(b) by 17 days.

(21) Appl. No.: 15/545,097

(22) PCT Filed: Jan. 20, 2016

(86) PCT No.: PCT/EP2016/051125
§ 371 (c)(1),
(2) Date: Aug. 24, 2018

(87) PCT Pub. No.: WO2016/116498
PCT Pub. Date: Jul. 28, 2016

(65) Prior Publication Data
US 2018/0314784 A1    Nov. 1, 2018

(30) Foreign Application Priority Data
Jan. 20, 2015 (EP) .................................... 15305057

(51) Int. Cl.
*G06F 17/50* (2006.01)
*G06F 15/78* (2006.01)
(Continued)

(52) U.S. Cl.
CPC .......... *G06F 17/5072* (2013.01); *G06F 3/064* (2013.01); *G06F 12/0646* (2013.01);
(Continued)

(58) Field of Classification Search
CPC ............ G06F 12/0646; G06F 15/7807; G06F 17/5045; G06F 17/5072; G06F 17/5077;
(Continued)

(56) References Cited

U.S. PATENT DOCUMENTS 2,680,822 A   6/1954  Brainard
4,568,846 A * 2/1986  Kapadia ................. H02K 21/46
                                                310/156.83
(Continued)

FOREIGN PATENT DOCUMENTS

DE   10 2012 110 157 A1   6/2014
EP        0 609 645 A1    8/1994
WO       2011/141435 A2  11/2011

OTHER PUBLICATIONS

Extended European Search Report and Opinion issued in connection with corresponding EP Application No. 15305057.0 dated Aug. 27, 2015.
(Continued)

*Primary Examiner* — Vuthe Siek
(74) *Attorney, Agent, or Firm* — Wood IP LLC

(57) ABSTRACT

A magnetic mass for an electric machine rotor movable about an axis extends along the axis and comprises: first longitudinal through-holes able to receive a respective first tie rod and at a first distance with respect to the axis of rotation, in a radial direction substantially perpendicular to the axis of rotation; first tie rods, received in a respective first longitudinal hole. The magnetic mass also comprises: at least one second longitudinal through-hole able to receive a respective second tie rod and at a second distance with
(Continued)

respect to the axis of rotation in a radial direction substantially perpendicular to the axis of rotation, the second distance being different from the first distance, and at least one second tie rod received in a respective second longitudinal hole.

11 Claims, 2 Drawing Sheets

(51) Int. Cl.
*G06F 12/06* (2006.01)
*G06F 3/06* (2006.01)
*H02K 1/28* (2006.01)
*H02K 17/16* (2006.01)
*H02K 15/00* (2006.01)

(52) U.S. Cl.
CPC ...... *G06F 15/7807* (2013.01); *G06F 17/5045* (2013.01); *G06F 17/5077* (2013.01); *H02K 1/28* (2013.01); *H02K 15/0012* (2013.01); *H02K 17/165* (2013.01); *G06F 2212/2542* (2013.01); *G06F 2213/0038* (2013.01)

(58) Field of Classification Search
CPC ..... G06F 2212/2542; G06F 2213/0038; G06F 3/064; G06F 12/06; G06F 15/78; G06F 3/06; H02K 15/0012; H02K 17/165; H02K 1/28; H02K 15/00; H02K 17/16
See application file for complete search history.

(56) References Cited

U.S. PATENT DOCUMENTS

2013/0062991 A1* 3/2013 Okai .................. H02K 1/26
310/216.123
2017/0040855 A1* 2/2017 Saint-Michel ....... H02K 1/2766

OTHER PUBLICATIONS

International Search Report and Written Opinion issued in connection with corresponding PCT Application No. PCT/EP2016/051125 dated Jul. 14, 2016.

* cited by examiner

MAGNETIC MASS FOR ROTOR, AND CORRESPONDING ROTOR, ELECTRIC MACHINE AND MANUFACTURING METHOD

FIELD OF INVENTION

The present invention relates to a magnetic mass for an electric machine rotor and also relates to a rotor of this type. The present invention also relates to an electric machine comprising a rotor of this type. The present invention also relates to a method for manufacturing a magnetic mass of this type.

BACKGROUND OF THE INVENTION

Document EP-A-0 609 645 describes a rotor comprising a magnetic mass and a short-circuit cage. The short-circuit cage comprises two short-circuit rings and a plurality of conductive bars each electrically connecting the short-circuit rings. The magnetic mass comprises a stack of rotor laminations and longitudinal tie rods for holding the stack, which pass through the magnetic rotor laminations.

BRIEF DESCRIPTION OF THE INVENTION

An objective of embodiments of the invention is therefore to propose a rotor comprising tie rods for mechanically holding rotor laminations, said tie rods making it possible to dispense with a shaft passing through the magnetic rotor laminations.

To this end, embodiments relate to a magnetic mass for an electric machine rotor movable about an axis of rotation, in which the magnetic mass extends along the axis of rotation and comprises a plurality of first longitudinal through-holes, each first longitudinal hole being able to receive a respective first tie rod and being at a first distance with respect to the axis of rotation, in a radial direction substantially perpendicular to the axis of rotation, and a plurality of first tie rods, each first tie rod being received in a respective first longitudinal hole.

The magnetic mass additionally comprises at least one second longitudinal through-hole, the or each second longitudinal hole being able to receive a respective second tie rod and being at a second distance with respect to the axis of rotation in a radial direction substantially perpendicular to the axis of rotation, the second distance being different from the first distance, and at least one second tie rod, the or each second tie rod being received in a respective second longitudinal hole.

The magnetic rotor laminations therefore are not perforated at the center thereof, which reduces the mechanical stresses thereof during rotation at high speeds.

In accordance with further aspects of the invention, the magnetic mass comprises one or more of the following features, taken individually or in any technically feasible combination: the second distance is less than or equal to 95% of the first distance, in an embodiment less than or equal to 90% of the first distance, in a further embodiment less than or equal to 70% of the first distance; the first longitudinal holes and the second longitudinal holes are evenly distributed angularly in a plane substantially perpendicular to the axis of rotation; the first distance is between 200 mm and 550 mm, particularly between 225 mm and 500 mm, more particularly between 325 mm and 450 mm; the sum of the number of first longitudinal holes and of the number of second longitudinal holes is greater than 18, particularly greater than 30, more particularly greater than 40; the number of first longitudinal holes is equal to twice the number of second longitudinal holes; the magnetic mass also comprises at least one third longitudinal through-hole, each third longitudinal hole being able to receive a respective third tie rod and being at a third distance with respect to the axis of rotation in a radial direction substantially perpendicular to the axis of rotation, the third distance being different from the first distance and from the second distance, and at least one third tie rod, the or each third tie rod being received in a respective third longitudinal hole.

Embodiments of the invention also relate to an electric machine rotor movable about an axis of rotation and comprising a magnetic mass as defined above, and a short-circuit cage extending along the axis of rotation and comprising two short-circuit rings placed on either side of the magnetic mass along the axis of rotation, and a plurality of electrically conductive bars, each electrically connecting the two short-circuit rings.

In addition, an embodiment of the invention also relates to an electric machine, in particular an asynchronous machine, particularly a motor, comprising a stator and a rotor as defined above.

Embodiments of the invention also relate to a method for manufacturing a magnetic mass for an electric machine rotor as defined above, the rotor being movable about an axis of rotation, the method comprising the steps of: providing a magnetic mass extending along the axis of rotation and comprising a plurality of first longitudinal through-holes, each first longitudinal hole being able to receive a respective first tie rod and being at a distance with respect to the axis of rotation in a radial direction substantially perpendicular to the axis of rotation equal to a first distance, and at least one second longitudinal through-hole, the or each second longitudinal hole being able to receive a respective second tie rod and being at a distance with respect to the axis of rotation in a radial direction substantially perpendicular to the axis of rotation equal to a second distance, the second distance being different from the first distance, inserting a plurality of first tie rods, each first tie rod being inserted into a respective first longitudinal hole, inserting at least one second tie rod, the or each second tie rod being inserted into a respective second longitudinal hole.

BRIEF DESCRIPTION OF THE DRAWINGS

Further features and advantages of the invention will become clearer upon reading the following description of embodiments of the invention, given solely by way of non-limiting example and with reference to the drawings, in which.

DETAILED DESCRIPTION

As is conventional, the expression "substantially equal to" shall imply equality to within 5% in either direction.

Figure 1:
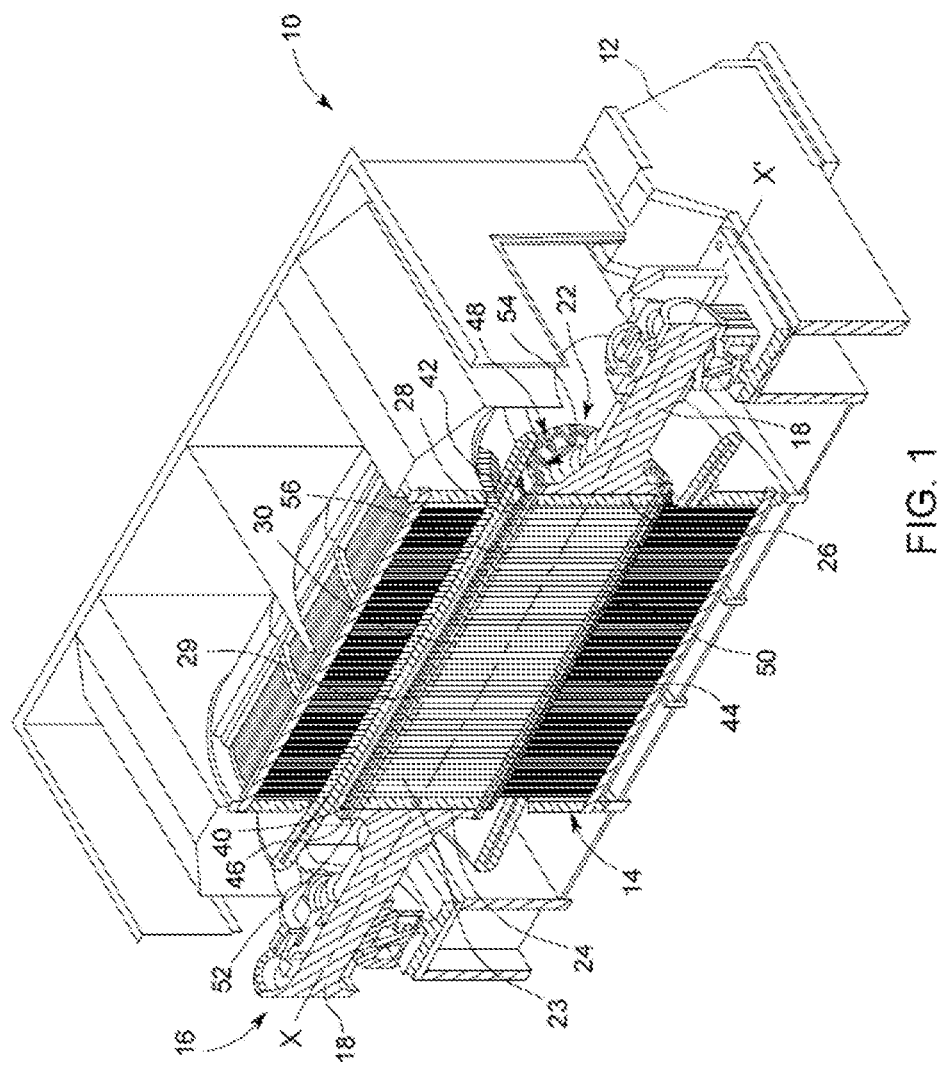
FIG. 1 is a schematic axial sectional view of an electric machine.

FIG. 1 shows an electric machine, denoted by the general reference 10. The electric machine 10 is, in an embodiment, an asynchronous machine, in particular an asynchronous motor.

The machine 10 comprises a casing 12, a stator 14, a rotor 16 and two shafts 18.

The machine 10 is designed to operate at very high speeds, for example speeds ranging from 3,000 revolutions/minute to 30,000 revolutions per minute, and has a strong electrical power, for example greater than 10 megawatts (MW), particularly greater than 50 MW.

The casing 12 and the stator 14 are known elements and therefore are not described in greater detail.

The rotor 16 defines an axis of rotation X-X' also referred to as the longitudinal axis. Hereinafter, the terms "axially", "radially" and "circumferentially" will be used with respect to the axis X-X'.

The rotor 16 is connected to the shaft 18 and comprises a short-circuit cage 22 and a magnetic mass 23.

The rotor 16 is a rotor of significant mass, for example greater than 300 kilograms (kg), in an embodiment greater than 10,000 kilograms.

The short-circuit cage 22 comprises a first electrical short-circuit ring 24, a second short-circuit ring 26 and a plurality of electrically conductive bars 28.

The magnetic mass 23 comprises a stack of rotor laminations and first tie rods 29 and second tie rods 30 for holding the stack.

The magnetic mass 23 extends along the longitudinal axis X-X' and is delimited by a periphery.

The mass 23 comprises a plurality of bar seats 32, a plurality of first longitudinal through-holes 34 able to receive the first tie rods 29, and a plurality of second longitudinal through-holes 35 able to receive the second tie rods 30.

The first short-circuit ring 24 and the second short-circuit ring 26 are disposed on either side of the ends of the magnetic mass 23.

Each short-circuit ring 24, 26 is a circular disc disposed coaxially with the axis of rotation X-X'. The first short-circuit ring 24 is disposed on one axial side of the magnetic mass 23, whereas the second short-circuit ring 26 is disposed on the other axial side of the magnetic mass 23.

Each short-circuit ring 24, 26 is fixed axially with respect to the magnetic mass 23 or with respect to the shafts 18. Each short-circuit ring 24, 26 is for example clamped between the shafts 18 and the magnetic mass 23. In a variant, the short-circuit ring 24, 26 is fixed to any other intermediate piece of the shafts 18 or of the magnetic mass 23.

Each short-circuit ring 24, 26 is for example made of metal, in an embodiment made of copper. Each short-circuit ring 24, 26 is made integrally, in particular from one piece, in an embodiment.

Each short-circuit ring 24, 26 is provided with a plurality of axial cavities able to receive a bar 28, a first tie rod 29, or a second tie rod 30.

Each bar 28 comprises a first end part 40, a second end part 42 and a middle part 44 extending between the end parts 40, 42. The bars 28 are for example made of metal, for example copper. The bars 28 are disposed parallel to the axis of rotation X-X'. In addition, the middle part 44 has a circular section, for example.

Each bar 28 is made integrally, in particular from one piece. The first end part 40 is mechanically and electrically connected to the first short-circuit ring 24. The second end part 42 is also electrically and mechanically connected to the second short-circuit ring 26.

Each first tie rod 29 comprises a first end part 46, a second end part 48 and a middle part 50 extending between the end parts 46, 48. The first tie rods 29 are made of a material having a greater rigidity than the material of the bars 28. The first tie rods 29 are disposed parallel to the axis of rotation X-X'. In addition, the middle part 50 of the tie rods 29 has a circular section. Each first tie rod 29 is made integrally, in particular from one piece. The first tie rods 29 make it possible to assure the mechanical holding of the stack of rotor laminations by abutment against the short-circuit rings 24, 26, which in turn are in abutment against the shafts 18.

Each second tie rod 30 comprises a first end part 52, a second end part 54 and a middle part 56 extending between the end parts 52, 54, and the second tie rods are made of a material having a greater rigidity than the material of the bars 28. The material of the second tie rods 30 is the same as the material of the first tie rods 29, in an embodiment. The second tie rods 30 are disposed parallel to the axis of rotation X-X'. In addition, the middle part 56 of the second tie rods 30 has a circular section. The circular section of the middle parts 56 of the second tie rods 30 is the same as the circular section of the middle part 50 of the first tie rods 29, in an embodiment. Each second tie rod 30 is made integrally, in particular from one piece. The second tie rods 30 make it possible to assure the mechanical holding of the stack of rotor laminations by abutment against the short-circuit rings 24, 26, which are in turn in abutment against the shafts 18. The tie rods 29, 30 are for example made of metal, for example steel.

The number of bar seats 32 is the same as the number of bars 28. Thus, each bar is associated with a respective bar seat 32. Each bar seat 32 has a transverse section complementary to the middle part 44 of the bar 28. This transverse section is thus circular in the presented example. Each seat 32 has a diameter denoted $\varphi 1$ hereinafter. In addition, each seat 32 extends level with the short-circuit rings 24, 26 in two first axial cavities 36.

Figure 2:
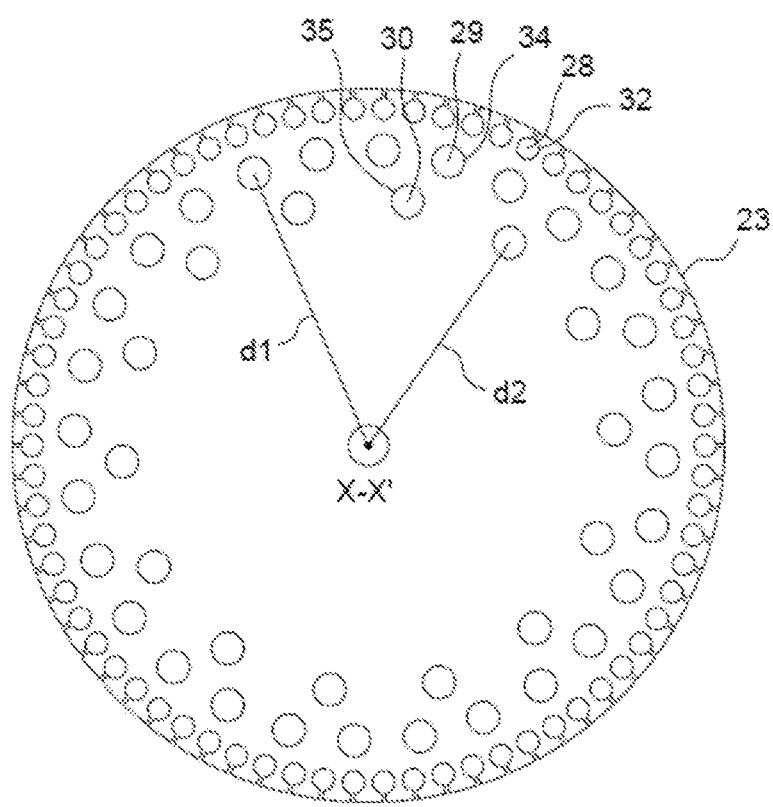
FIG. 2 is a sectional view of the magnetic mass of the rotor from FIG. 1 in a plane perpendicular to the axis of rotation of the rotor.

The number of first longitudinal holes 34 varies between 12 and 36. In the example of FIG. 2, twenty-eight first longitudinal holes 34 are visible. In addition, the number of first longitudinal through-holes 34 is the same as the number of first tie rods 29. Thus, each first tie rod 29 is associated with a respective first longitudinal hole 34.

Each first longitudinal hole 34 has a cross section complementary to the middle part 50 of the first tie rod 29. This cross section is therefore circular in the example shown. Each first longitudinal hole 34 has a diameter denoted $\varphi 2$ hereinafter. The diameter $\varphi 2$ of the first longitudinal holes 34 is smaller than the diameter $\varphi 1$ of the seats 32. In addition, each first longitudinal hole 34 level with the short-circuit rings 24, 26 in two second axial cavities 38.

Each first longitudinal hole 34 is at a first distance d1 with respect to the longitudinal axis X-X' in a radial direction substantially perpendicular to the axis of rotation X-X'. The first distance d1 of a first longitudinal hole 34 with respect to the longitudinal axis X-X' corresponds to the distance between the center of the first longitudinal hole 34 and the longitudinal axis X-X'. The first distance d1 is evaluated in a plane perpendicular to the longitudinal axis X-X', for example the plane of FIG. 2. Such a distance is referred to as the "radial distance" hereinafter in the description. The first instance d1 is between 200 mm and 550 mm, in an embodiment between 225 mm and 500 mm, in a further embodiment between 325 mm and 450 mm. The value of the first distance d1 is identical for all the first longitudinal holes 34 to more or less 1%, particularly to more or less 0.1%. The value of the first distance d1 is between 70% and 90% of the outer radius of the magnetic mass 23, in an embodiment between 75% and 85%.

The first longitudinal holes 34 are evenly distributed angularly in a plane substantially perpendicular to the axis of rotation X-X'.

The number of second longitudinal holes 35 varies between 6 and 36. In the example of FIG. 2, fourteen second longitudinal holes 35 are visible. As a result of this, the sum of the number of first longitudinal holes 34 and of the number of second longitudinal holes 35 is greater than 18, in an embodiment greater than 30 or greater than 40. This makes it possible to better distribute the first tie rods 29 and the second tie rods 30. In addition, in this particular example of FIG. 2, the number of first longitudinal holes 34 is equal to twice the number of second longitudinal holes 35. In addition, the number of second longitudinal through-holes 35 is the same as the number of second tie rods 30. Thus, each second tie rod 30 is associated with a respective second longitudinal hole 35.

Each second longitudinal hole 35 has a cross section complementary to the middle part 56 of the second tie rod 30. This cross section is thus circular in the example presented. Each second longitudinal hole 35 has a diameter denoted φ3 hereinafter. The diameter φ3 of the second longitudinal holes 35 is smaller than the diameter φ1 of the seats 32. For example, the diameter φ3 of the second longitudinal holes 35 is smaller than the diameter φ2 of the first longitudinal holes 34. In addition, each second longitudinal hole 35 extends level with the short-circuit rings 24, 26 in two second axial cavities 39.

Each second longitudinal hole 35 is at a second radial distance d2 with respect to the longitudinal axis X-X'. The second radial distance d2 is different from the first distance d1. The second distance d2 is less than 95% of the first distance d1.

In the example of FIG. 1 the second distance d2 is less than or equal to 90% of the first distance d1. In accordance with a variant the second distance d2 is less than or equal to 70% of the first distance d1.

The second longitudinal holes 35 are evenly distributed angularly in a plane substantially perpendicular to the axis of rotation X-X'.

The magnetic mass 23 is manufactured as follows.

The different rotor laminations are first formed, then, for each tie rod 29, 30, the one or more first and second longitudinal holes 34, 35 are formed by cutting the magnetic laminations of the magnetic mass 23. In addition, the seats 32 are also cut in the magnetic laminations of the magnetic mass 23. The manufacture of the magnetic mass 23 comprises the insertion of the first tie rods 29 in the first longitudinal holes 34 and the insertion of the second tie rods 30 in the second longitudinal holes 35.

The magnetic mass 23 is thus particularly easy to manufacture, by compacting the rotor laminations under pressure against the shafts 18. The compaction pressure exerted axially on the rotor laminations of the magnetic mass 23 is obtained by a tension of the tie rods 29, 30 mechanically connected at their ends to the shafts 18. The tensile stress in the tie rods 29, 30 tenses the shafts 18 towards one another axially, thus making it possible to obtain a pressure axially on the rotor laminations for the mechanical holding of the stack of rotor laminations forming the magnetic mass 23.

In addition, a magnetic mass 23 of this type makes it possible to distribute the stress exerted on the longitudinal tie rods 29, 30 at a number of locations situated at different radial distances with respect to the longitudinal axis X-X'.

A person skilled in the art will understand that for rotors rotating at very high rotational speeds, with a circumferential speed at the periphery of the magnetic mass 23 exceeding 100 meters per second, embodiments of the invention makes it possible to dispense with a shaft 18 passing through the magnetic mass 23. In effect, a through-shaft requires a hole to be cut in the center of the rotor laminations of the magnetic mass 23, said hole serving to accommodate the shaft. The mechanical stresses in the rotor laminations caused by the centrifugal force are very significant at very high rotational speeds, thus leading to a permanent and excessive radial deformation of the central hole, which is detrimental to the mechanical connection between the through-shaft and the magnetic mass. Without a through-shaft, the mechanical stresses of centrifugal origin at the center of the rotor laminations are weaker than with the presence of a central hole, thus making it possible to provide rotors that rotate at greater rotational speeds compared with the rotors that have a through-shaft.

The rigidity of the rotor 16 and therefore of the magnetic mass 23 thereof without through-shaft is assured by a strong axial pressure on the rotor laminations, this being an axial pressure that is significantly increased compared with that for a rotor with through-shaft. This effect of strong pressure, making it possible by grip between the rotor laminations to assure the mechanical holding of the magnetic mass 23, is obtained by a higher number of tie rods because these are distributed at a number of different radial distances, thus making it possible to increase the number of tie rods and therefore the pressure on the rotor laminations, and therefore the rigidity of the rotor 16.

The effect is increased further for a magnetic mass 23 having other longitudinal holes at other radial distances. For example, in accordance with a variant, the magnetic mass also comprises at least one third longitudinal through-hole (not shown), each third longitudinal hole being able to receive a respective third tie rod and being at a third distance d3 with respect to the axis of rotation in a radial direction substantially perpendicular to the axis of rotation X-X', the third distance d3 being different from the first distance d1 and from the second distance d2.

A person skilled in the art will understand that the invention applies generally to a magnetic mass 23 comprising a plurality of longitudinal holes, in which at least two holes from the plurality of longitudinal holes are disposed at different radial distances with respect to the axis of rotation. The magnetic mass 23 also comprises a plurality of longitudinal tie rods received in the longitudinal holes described above, and at least two tie rods from the plurality of longitudinal tie rods are thus disposed at different radial distances with respect to the axis of rotation (X-X').

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic mass for an electric machine rotor, the rotor being movable about an axis of rotation, the magnetic mass extending along the axis of rotation and being non-perforated at a center thereof, and comprising:
    a plurality of first longitudinal through-holes, each first longitudinal hole being able to receive a respective first tie rod and being at a first distance with respect to the axis of rotation, in a radial direction substantially perpendicular to the axis of rotation, a plurality of first tie rods, each first tie rod being received in a respective first longitudinal hole, at least one second longitudinal through-hole, the or each second longitudinal hole being able to receive a respective second tie rod and being at a second distance with respect to the axis of rotation in a radial direction substantially perpendicular to the axis of rotation, the second distance being different from the first distance, and at least one second tie rod, the or each second tie rod being received in a respective second longitudinal hole.

2. The magnetic mass as claimed in claim 1, wherein the second distance is less than or equal to 95% of the first distance.

3. The magnetic mass as claimed in claim 1, wherein the first longitudinal holes and the second longitudinal holes are evenly distributed angularly in a plane substantially perpendicular to the axis of rotation.

4. The magnetic mass as claimed in claim 1, wherein the first distance is between 200 mm and 550 mm.

5. The magnetic mass as claimed in claim 1, wherein the sum of the number of first longitudinal holes and of the number of second longitudinal holes is greater than 18.

6. The magnetic mass as claimed in claim 1, wherein the number of first longitudinal holes is equal to twice the number of second longitudinal holes.

7. The magnetic mass as claimed in claim 1, further comprising:

at least one third longitudinal through-hole, each third longitudinal hole being able to receive a respective third tie rod and being at a third distance with respect to the axis of rotation in a radial direction substantially perpendicular to the axis of rotation, the third distance being different from the first distance and from the second distance, and at least one third tie rod, the or each third tie rod being received in a respective third longitudinal hole.

8. The magnetic mass as claimed in claim 1, wherein the respective first longitudinal hole and the respective second longitudinal hole are diagonally spaced apart from each other, adjacent to a periphery of the magnetic mass.

9. An electric machine rotor movable about an axis of rotation and comprising:

a magnetic mass being non-perforated at a center thereof, and a short-circuit cage extending along the axis of rotation and comprising:

two short-circuit rings placed on either side of the magnetic mass along the axis of rotation, and a plurality of electrically conductive bars, each electrically connecting the two short-circuit rings.

10. The rotor according to claim 9, wherein the rotor is mechanically associated with an electric motor comprising a stator and the rotor.

11. A method for manufacturing a magnetic mass for an electric machine rotor, the rotor being movable about an axis of rotation, the method comprising the steps of:

providing a magnetic mass extending along the axis of rotation and being non-perforated at a center thereof, and comprising:

a plurality of first longitudinal through-holes, each first longitudinal hole being able to receive a respective first tie rod and being at a distance with respect to the axis of rotation in a radial direction substantially perpendicular to the axis of rotation equal to a first distance, at least one second longitudinal through-hole, the or each second longitudinal hole being able to receive a respective second tie rod and being at a distance with respect to the axis of rotation in a radial direction substantially perpendicular to the axis of rotation equal to a second distance, the second distance being different from the first distance, inserting a plurality of first tie rods, each first tie rod being inserted into a respective first longitudinal hole, inserting at least one second tie rod, the or each second tie rod being inserted into a respective second longitudinal hole.

\* \* \* \* \*